United States Patent [19]

Azuma et al.

[11] Patent Number: 5,320,919
[45] Date of Patent: Jun. 14, 1994

[54] COPPER FOIL FOR INNER LAYER CIRCUIT OF MULTI-LAYERED PRINTED CIRCUIT BOARD, METHOD OF PRODUCING THE SAME AND MULTI-LAYERED PRINTED CIRCUIT BOARD HAVING THE SAME

[75] Inventors: Keiji Azuma; Kimikazu Katoh, both of Utsunomiya; Ryoichi Oguro, Imaichi; Takashi Inada, Tochigi, all of Japan

[73] Assignees: Sumitomo Bakelite Company Limited; Circuit Foil Japan Co., Ltd., both of Tokyo, Japan

[21] Appl. No.: 706,053

[22] Filed: May 28, 1991

[30] Foreign Application Priority Data

Jun. 8, 1990 [JP] Japan ................. 2-148781
Nov. 27, 1990 [JP] Japan ................. 2-321250
Mar. 13, 1991 [JP] Japan ................. 3-072086

[51] Int. Cl.$^5$ ............................... B22F 7/04
[52] U.S. Cl. ............................. 428/546; 428/551; 428/552; 428/553; 428/606; 428/607; 428/647; 428/658; 428/666; 428/668; 428/674; 428/675; 428/678; 205/125; 205/152; 205/154; 205/155; 205/156
[58] Field of Search ............... 428/546, 548, 551, 552, 428/553, 606, 607, 646, 647, 657, 658, 660, 663, 666, 668, 674, 675, 678; 205/125, 152, 154, 155, 156, 197

[56] References Cited

U.S. PATENT DOCUMENTS

| Re. 30,180 | 12/1979 | Wolski et al. | 428/601 |
|---|---|---|---|
| 2,702,252 | 2/1955 | Suchoff | 117/45 |
| 3,573,008 | 3/1971 | Akin, Jr. | 29/199 |
| 3,585,010 | 6/1971 | Luce et al. | 29/191.2 |
| 3,857,681 | 12/1974 | Yates et al. | 29/195 |
| 3,918,926 | 11/1975 | Wolski et al. | 29/195 |
| 3,981,691 | 9/1976 | Cuneo | 29/195 |
| 4,190,474 | 2/1980 | Berdan et al. | 156/151 |
| 4,193,849 | 3/1980 | Sato | 204/38 B |
| 4,204,187 | 5/1980 | Kakuhashi et al. | 338/307 |
| 4,260,449 | 4/1981 | Berdan et al. | 156/628 |
| 4,368,252 | 1/1983 | Kakuhashi et al. | 430/312 |
| 4,376,154 | 3/1983 | Nakatsugawa | 428/607 |
| 4,386,139 | 5/1983 | Nakatsugawa | 428/607 |
| 4,394,419 | 7/1983 | Konicek | 428/416 |
| 4,468,293 | 8/1984 | Polan et al. | 204/27 |
| 4,483,906 | 11/1984 | Nakatsugawa | 428/607 |
| 4,503,112 | 3/1985 | Konicek | 428/416 |
| 4,572,768 | 2/1986 | Wolski et al. | 204/15 |
| 4,619,871 | 10/1986 | Takami | 428/607 |
| 4,650,700 | 3/1987 | Kitamura et al. | 427/255.6 |
| 4,750,976 | 6/1988 | Hupe et al. | 204/15 |
| 4,935,310 | 6/1990 | Nakatsugawa | 428/607 |
| 4,997,722 | 3/1991 | Adler | 428/596 |
| 5,019,222 | 5/1991 | Hino et al. | 204/27 |

FOREIGN PATENT DOCUMENTS

| 0099086 | 1/1984 | European Pat. Off. | |
| 0185303 | 6/1986 | European Pat. Off. | |
| 55-102288 | 8/1980 | Japan | 428/658 |
| 61-67796 | 4/1986 | Japan | 428/606 |
| 63-183178 | 7/1988 | Japan | 428/658 |

OTHER PUBLICATIONS

World Patent Index Latest Week 9119, Mar. 25, 1991, Derwent Publications Ltd., London, GB. AN 91-135474 & JP-A-3 068 795.

*Primary Examiner*—Peter A. Nelson
*Assistant Examiner*—Chrisman D. Carroll
*Attorney, Agent, or Firm*—Frishauf, Holtz, Goodman & Woodward

[57] ABSTRACT

A copper foil for an inner layer circuit of a multi-layered printed circuit board, which comprises a black metal plated layer formed on at least the rough surface which becomes a surface of an inner layer circuit of a copper foil having both sides roughened in advance, in order to enhance the bonding strength to a prepreg, make it safe from haloing and facilitate optical checking of the copper foil.

26 Claims, No Drawings

COPPER FOIL FOR INNER LAYER CIRCUIT OF MULTI-LAYERED PRINTED CIRCUIT BOARD, METHOD OF PRODUCING THE SAME AND MULTI-LAYERED PRINTED CIRCUIT BOARD HAVING THE SAME

BACKGROUND OF THE INVENTION

The present invention relates to copper foil for an inner layer circuit of a multi-layered printed circuit board, which has high bonding strength with prepreg, is not susceptible to haloing and facilitates an optical inspection, a method of producing the same and multi-layered printed circuit board having the same.

Conventionally, a multi-layered printed circuit board is manufactured in the following steps. First, phenolic resin, epoxy resin, polyimide resin, epoxy modified polyimide resin or thermosetting resin, such as cyanate esters, is impregnated in glass fiber fabric and nonwoven fabric, linear polyester fiber fabric and nonwoven fabric, carbon fiber and nonwoven fabric, polyamideimide fiber fabric and nonwoven fabric, or insulating base material such as paper, and the resultant structure is dried, providing prepreg. On one or bonded plural prepreg boards obtained in the above manner, a copper foil is laminated, yielding a copper-clad, laminated board. Then, the unnecessary copper foil portion on the surface of the board is etched away, providing an inner layer circuit. The copper surface of the inner layer circuit is subjected to a roughening treatment or oxidation treatment to improve the bonding strength with the prepregs. Then, an outer layer laminate is laminated on the resultant structure, and through holes are formed in the outer layer laminate for connection between the inner layer circuit and an outer layer circuit. A copper layer is formed on the through hole portions to provide conductivity, using electroless plating or the like, and the outer layer circuit is etched, yielding a multi-layered printed circuit board.

In this fabrication of a multi-layered printed circuit board, the copper foil for the inner layer circuit undergoes various processing steps and is put under strict use conditions after the formation of the circuit board. Due to recent severer processing conditions and use conditions, the copper surface of the inner layer circuit is subjected to one of the following three conventional processes in order to further improve the bonding strength between the inner layer circuit and the prepregs.

(1) After the inner layer circuit is formed using an ordinary one-side roughened copper foil, a brown or black copper oxide, called "brown oxide" or "black oxide," is formed on the copper surface using a chemical treatment liquid containing an oxidizing agent.

(2) The black oxide mentioned above is treated with a reducing agent, such as formalin, thereby forming a reduced copper (Japanese Provisional Patent Publication No. 310595/89).

(3) A copper foil with both sides roughened available on the market is to be used.

However, the copper foil for an inner layer circuit comprising the black oxide as in the case (1) has poor chemical resistance, and is susceptible to haloing. Further, the copper foil for an inner layer circuit having the brown oxide has insufficient chemical resistance and has lower bonding strength to the prepregs.

With regard to the copper foil for an inner layer circuit comprising the reduced copper as in the case (2), at the time when the inner layer circuit after its formation is subjected to automatic optical inspection using VISION 206 AOI, a product of Optrotech Co., Ltd., a high speed automated optical inspection device for printed circuit boards, which serves to provide for the inspection of the outward appearance of printed circuit boards, an erroneous inspection is often done in the AOI (automated optical inspection) due to a little color difference between the copper color of the circuit portion and the color of the insulating layer portion. This requires a significant time for confirmation of the inspection and may easily result in overlooking of circuit defects. The efficiency and reliability of the checking are therefore insufficient.

As regards the copper foil which has both sides roughened as in the case (3) for an inner layer circuit, because of a small color difference between the copper color of the circuit portion and the color of the insulating layer portion in the same way as the case of (2), the efficiency and reliability of the checking are insufficient. In addition, when the circuit board is left in the air after the formation of the circuit portions, the copper portion is likely to rust.

The above conventional processes should employ batch processing methods in which a single board is dipped in a treating tank as long as a board after being pressed or etched is treated, thus requiring a great amount of investment and processing time. The inner layer circuit to be treated still has some uncompleted circuit portions, such as through holes, or electrically unconnected portions, therefore, inevitably the roughening treatment or so-called black-oxide treatment to improve the bonding strength with the prepregs should be done by a mechanical process (such as grinding) or by using chemicals only without applying electricity.

The conventional processes are therefore insufficient and need longer processing time as compared with electrochemical processes which perform the roughening treatment efficiently with electricity applied to the circuit board.

Further, when a copper foil is subjected to a melanism treatment with copper sulfate, the bonding strength between the base of the copper foil and the treated layer is weak so that the treated layer is likely to peel off due to thermal expansion or contraction. The resultant printed circuit board has therefore a low reliability.

SUMMARY OF THE INVENTION

It is therefore an object of the present invention to provide a copper foil for an inner layer circuit of a multi-layered printed circuit board, which has high bonding strength between the inner layer circuit and prepreg, an excellent property against haloing and high efficiency and reliability of the AOI inspection, and permits fabrication of a multi-layered board without requiring a roughening treatment or black-oxide treatment that has conventionally been done in a batch type chemical treatment. It is also an object to provide a method of fabricating the same and a multi-layered printed circuit board having the same.

The present inventors found out that an improved copper foil for a printed circuit board which has high bonding strength between the inner layer circuit and a prepreg, an excellent property against haloing and high efficiency and reliability of the AOI which is conventionally conducted after an inner layer circuit is formed, and cannot involve an electrochemical treatment due to no electricity applicable to the entire circuit surface thus requiring a considerable amount of investment and processing time with a result of an insufficient effect.

According to one aspect of the present invention, there is provided a copper foil for an inner layer circuit of a multi-layered printed circuit board comprising a black metal plated layer formed on at least the rough surface which becomes a surface of an inner layer circuit of a copper foil having both sides roughened in advance.

According to another aspect of the present invention, there is provided a method of producing a copper foil for an inner layer circuit of a multi-layered printed circuit board, comprising the steps of roughening both sides of a copper foil and forming a black metal plated layer on the copper foil.

According to a further aspect of the present invention, there is provided a multi-layered printed circuit board having the aforementioned copper foil.

DETAILED DESCRIPTION OF THE PREFERRED EMBODIMENT

The present invention will be described in detail below.

As a copper foil having both sides roughened, which is used in the present invention, those acquired by known methods may be used: a copper foil subjected to cathode processing in a copper sulfate bath of a sulfuric acid to thereby have coarse particles stuck on its surfaces (see Japanese Patent Publication Nos. 38053/79, 39327/78, and 38700/78), and a copper foil subjected to anode processing in an acidic bath for etching its surfaces, thereby having roughened surfaces (see Japanese Patent Publication No. 54592/86). Also, both electrodeposited copper and rolled copper may be used.

A copper foil for a multi-layered printed circuit board of the present invention comprises a black metal plated layer formed on at least the rough surface which becomes a surface of an inner layer circuit of the copper foil having both sides roughened.

There are no particular restrictions on the black metal plated layer (hereinafter referred to as "black plated layer") for use in the present invention as long as color of the plated metal is black. The black plated layer may be a so-called burnt plated layer of metal acquired by processing at a current density of a critical current or a current density in the vicinity thereof, or a plated layer acquired by processing a metal at a current density lower than the critical current density.

A plated layer containing one or more metals selected among nickel, cobalt, chromium, rhodium and tin is preferable as the black plated layer used in the present invention. It is more preferable to use a plated layer which contains nickel, nickel-copper alloy, nickel-tin alloy, nickel-tin-copper alloy, tin, tin-cobalt alloy, chromium, and rhodium.

It is preferable that the black plated layer has such fine ruggendness as not to reflect visible rays and has a thickness that can maintain the rugged shapes of the roughened surfaces of the foil. The black plated layer has a thickness of 100 to 10,000 angstroms or preferably of 100 to 3,000 angstroms. The black plated layer should not necessarily cover the entire rough surfaces of the copper foil; the black plated layer may cover part of the upheaval portion as long as it looks black. Specifically, the black plated layer has a 15% or less of Y, specified in JIS Z 8701, preferably 14% or less, or more preferably 13% or less. Y exceeding 15% may result in many erroneous inspection, reducing the inspection efficiency and reliability.

The first paragraph of JIS Z 8701 indicates that this Japanese Industrial Standard provides the color specification systems for a 2° viewing angle and for a 10° viewing angle. The former system, hereinafter referred to as the "XYZ color specification system", is in accordance with the recommendation made by Commission Internationale de I'Eclairage (briefly CIE) in 1931 and the latter system, hereinafter referred to as the "$X_{10}Y_{10}Z_{10}$ color specification system", is in accordance with the supplementary recommendation made by the same organization in 1964.

The color specification using XYZ system and $X_{10}Y_{10}Z_{10}$ system apply to the cases where, when good correlation of luminous isochromaticity is required in respective visual fields undermentioned, an object makes a visual angle of 1° to 4° at observer's eyes and a visual angle exceeding 4°, respectively.

Specification of Colors

For the specification of colors, two values x and y of chromaticity coordinates and one value Y of tristimulus values are to be used or two values $x_{10}$ and $y_{10}$ of chromaticity coordinates and one value $Y_{10}$ of tristimulus values are to be used.

The numeral 10 suffixed to the values $x_{10}$ and $y_{10}$ of chromaticity coordinates and the value $Y_{10}$ of tristimulus values indicates that they are in terms of the $X_{10}Y_{10}Z_{10}$ color specification system.

Tristimulus Values of Object Colors Produced by Reflection:

The tristimulus values, X, Y and Z of the object color produced by reflection which are to be presented by using XYZ color specification system can be obtained by the use of the following formulae:

$$X = K \int_{383}^{733} S(\lambda)\bar{x}(\lambda)R(\lambda)d\lambda$$

$$Y = K \int_{383}^{733} S(\lambda)\bar{y}(\lambda)R(\lambda)d\lambda$$

$$Z = K \int_{383}^{733} S(\lambda)\bar{z}(\lambda)R(\lambda)d\lambda$$

$$K = \frac{100}{\int_{383}^{733} S(\lambda)\bar{y}(\lambda)d\lambda}$$

where
S(λ): relative spectral distribution of standard light to be used for color specification
$\bar{x}(\lambda)$, $\bar{y}(\lambda)$ and $\bar{z}(\lambda)$: isochromatic functions to be used for XYZ color specification system
R(λ): spectral configuration luminous reflection factor The value Y of the tristimulus values for the XYZ color specification system is in terms of a percentage, of the luminous reflection factor $R_g$.

The tristimulus values $X_{10}Y_{10}$ and $Z_{10}$ of an object color produced by reflection which are to be presented by using the $X_{10}$, $Y_{10}$ and $Z_{10}$ color specification system can be obtained by using the isochromatic functions $\bar{x}(\lambda)$, $\bar{y}(\lambda)$ and $\bar{z}(\lambda)$ for $X_{10}Y_{10}$ and $Z_{10}$ color specification system in place of the isochromatic functions $\bar{x}(\lambda)$, $\bar{y}(\lambda)$ and $\bar{z}(\lambda)$ given in the above formulae.

It is preferable that the black plated layer has the following ratio of metal compositions. For instance, for a black plated layer having nickel or a nickel-copper alloy, the amount of nickel is preferably 2 to 20 mg/dm$^2$.

For a black plated layer having a tin-nickel alloy, it is preferable that the amount of tin is 5 to 30 mg/dm$^2$ and the amount of nickel 2 to 12 mg/dm$^2$.

For a black plated layer having a nickel-tin-copper alloy, it is preferable that the amount of nickel is 1 to 20 mg/dm$^2$, the amount of tin 5 to 25 mg/dm$^2$ and the amount of copper 0.1 to 2 mg/dm$^2$.

For a black plated layer having a tin-cobalt alloy, it is preferable that the amount of tin is 5 to 15 mg/dm$^2$ and the amount of cobalt 10 to 30 mg/dm$^2$.

If the amount of each metal in the black plated layer is below the lower limit, there may be no color difference between this plated layer and the insulating layer. If the amount of each metal exceeds the upper limit, the color difference will not be improved much for an increase in cost, which is not desirable.

For a black plated layer containing chromium, the amount of chromium is preferably 0.2 to 5 mg/dm$^2$. If the amount of chromium is below 0.2 mg/dm$^2$, there may be no color difference between this plated layer and the insulating layer. If the amount of chromium exceeds 5 mg/dm$^2$, the color difference will not be improved much for an increase in the cost, which is also undesirable.

For a black plated layer containing rhodium, the amount of rhodium is preferably 5 to 15 mg/dm$^2$. If the amount of rhodium is below 5 mg/dm$^2$, there may be no color difference between this plated layer and the insulating layer. If it exceeds 15 mg/dm$^2$, the color difference will not be improved much for an increase in the cost, which is also undesirable.

A method as disclosed in, for example, Published Japanese Provisional Patent Publication No. 58502/80, may be employed to form a burnt plated layer of nickel or nickel-copper alloy on a copper foil. More specifically, this method provides burnt plating of nickel with the aforementioned amount under the conditions: bath compositions of nickel sulfate containing 1 to 6 g/l of nickel, copper sulfate containing 0.3 to 0.6 g/l of copper, 50 to 100 g/l of ammonium sulfate and 10 to 40 g/l of boric acid, 2.5 pH, a bath temperature of 20° to 50° C. and a current density of 2 to 10 A/dm$^2$. But, the plated-layer forming method is not limited to this particular type.

As an example of a method of forming a chromium black plated layer on a copper foil, the aforementioned amount of chromium may be plated on the copper foil under the conditions of bath compositions consisting of 225 to 300 g/l of chromium oxide anhydride, 210 to 218 g/l of acetic acid and 5 to 10 g/l of barium acetate, a bath temperature of 32° to 46° C. and a current density of 4 to 10 A/dm$^2$. But, the plated-layer forming method is not limited to this particular type.

As an example of a method of forming a black plated layer of a tin-cobalt alloy on a copper foil, the aforementioned amount of a tin-cobalt alloy may be plated on the copper foil under the conditions of bath compositions consisting of 8 to 15 g/l of tin pyrophosphate, 25 to 30 g/l of cobalt chloride, 275 to 350 g/l of potassium pyrophosphate, 75 to 125 ml/l of Ebaroi SNC #1 (an additive (brightener) for a tin-cobalt alloy plating a product by Ebara Yujilite Co., Ltd.), and 15 to 25 ml/l of Ebaroi SNC #3 (an additive (brightener) for a tin-cobalt alloy plating a product by Ebara Yujilite Co., Ltd.), a bath temperature of 45° to 55° C., a current density of 0.5 to 2.0 A/dm$^2$ and 8.5 to 8.8 pH. But, the plated-layer forming method is not limited to this particular type.

As an example of a method of forming a black plated layer of a tin-nickel alloy on a copper foil, the aforementioned amount of tin and the aforementioned amount of nickel may be plated on the copper foil under the conditions of bath compositions consisting of 8 to 15 g/l of tin pyrophosphate, 150 to 280 g/l of potassium pyrophosphate, 160 to 240 ml/l of Ebaroi nickel (an aqueous solution containing nickel phosphate as a main component, a product by Ebara Yujilite Co., Ltd.), and 10 to 20 ml/l of Ebaroi SNC #3 (a product by Ebara Yujilite Co., Ltd.), a bath temperature of 45° to 55° C., a current density of 0.5 to 2.0 A/dm$^2$ and 8.5 to 8.8 pH. But, the plated-layer forming method is not limited to this particular type.

As an example of a method of forming a black plated layer of a tin-nickel-copper alloy on a copper foil, the aforementioned amounts of tin, nickel and copper may be plated on the copper foil under the conditions of bath compositions consisting of 25 to 30 g/l of tin chloride, 28 to 35 to 35 g/l of nickel chloride, 180 to 250 g/l of potassium pyrophosphate, 2 to 3 g/l of copper sulfate, 18 to 25 g/l of glycine and 3 to 8 ml/l of aqueous ammonia, a bath temperature of 45° to 55° C., a current density of 0.1 to 1.0 A/dm$^2$ and 8.5 to 8.8 pH. But, the plated-layer forming method is not limited to this particular type.

As an example of a method of forming a black plated layer of a rhodium on a copper foil, the aforementioned amount of rhodium may be plated on the copper foil under the conditions of bath compositions consisting of 7 to 15 g/l of rhodium sulfate and 40 to 160 g/l of sulfuric acid, a bath temperature of 38° to 50° C., and a current density of 2.0 to 10 A/dm$^2$. But, the plated-layer forming method is not limited to this particular type.

EXAMPLES

Example 1

With a 35-$\mu$m thick electrodeposited copper foil as a cathode and lead disposed as an anode on both side of the cathode, the first-phase processing was conducted to attach copper particles on the rough surface and lustrous surface of the copper foil under the conditions of bath compositions consisting of copper sulfate containing 30 g/l of copper, 60 g/l of sulfuric acid, and arsenious acid containing 1 g/l of arsenic, a bath temperature of 24° C., a current density of 17 A/dm$^2$ and a processing time of 12 sec, and the resultant structure was sufficiently cleaned with water. Then, the second-phase processing was conducted to fix the copper particles on those surfaces under the conditions of bath compositions consisting of copper sulfate containing 70 g/l of copper, and 60 g/l of sulfuric acid, a bath temperature of 49° C., a current density of 21.5 A/dm$^2$ and a processing time of 12 sec.

After the resultant structure was immediately cleaned sufficiently with water, a nickel-copper alloy containing 5 mg/dm$^2$ of nickel was burnt-deposited on the lustrous surface of the copper foil under the conditions of bath compositions of nickel sulfate containing 4 g/l of nickel, copper sulfate containing 0.5 g/l of copper, 50 g/l of ammonium sulfate and 10 g/l of boric acid, a bath temperature of 25° C. and a cathode current density of 5.5 A/dm². The resultant structure was then cleaned with water.

Thereafter, zinc was plated on the rough surface of the copper foil under the conditions of bath compositions of zinc sulfate heptahydrate containing 5 g/l of zinc, 70 g/l of sodium hydroxide, a bath temperature of 25° C., a cathode current density of 0.5 A/dm² and a processing time of 1 sec. The resultant structure was immediately cleaned with water, and was then subjected to chromate conversion coating under the conditions of bath compositions of 25 g/l of sodium bichromate, 6 pH, a bath temperature of 45° C., a cathode current density of 2 A/dm² and a processing time of 1 sec. The resultant structure was cleaned with water and then was dried, yielding a copper foil for an inner layer circuit of a multi-layered printed circuit board.

The acquired copper foil for an inner layer circuit of a multi-layered printed circuit board was evaluated on the following items. The results of the evaluation are given in Tables 1 and 2.

In JIS C 6481 an apparatus and method for testing peel strength are described as follows:

The apparatus contains the following:
(1) Tension Tester: A tension tester with an error of ±1% which can keep its cross-head speed at about 50 mm per minute. The peeling force shall fall within 15% to 85% of the capacity of tester.
(2) Supporting Device: A supporting device which can keep the direction of peeling at 90° to the surface where the copper foil is removed from the base material.
(3) Vernier Calliper: The vernier calliper specified in JIS B 7507 with minimum readable scale of 0.05 mm, or a measuring apparatus equivalent or superior to it in accuracy.
(4) Fixture: A fixture which can fix specimen by adhesion or another method to keep the flatness.
(5) Solder Bath: A bath filled with molten solder to a depth of 50 mm or more, and provided with a control which can adjust the temperature at the intended position of the solder to the specified temperature within tolerances of ±1° C. throughout the temperature range of 200° to 300° C.
(6) Thermometer: A thermocouple or L shaped mercury thermometer scaled with 1° C. division over the temperature range of 200° to 300° C.
(7) Stopwatch: A stopwatch of 0.2 s scale.
(8) Specimen Gripper: A pair of tweezers or a similar specimen gripper.
(9) Heating and Heat Insulating Device: A heating and heat insulating device which can keep the specimen holder at a constant temperature.

The specimen shall be as follows: Cut out a piece having dimensions of 100 mm length, 25 mm width with a central portion thereof of a width of 10±0.1 mm, from the copper-clad laminate, and remove the copper foil on both sides by cutting with a knife or etching to obtain a copper foil of 10±0.1 mm width on the middle part of one side.

The test is as follows:
(1) Measurement under Normal Condition Set the specimen on the supporting device after detaching the copper foil on one end to an appropriate length, clamp the end of detached copper foil with the clamping device. Peel the copper foil about 50 mm continuously at a speed of about 50 mm per minute in a direction perpendicular to the copper foil surface. Define the minimum value of the load during this operation as the peel strength and express it in kN/m {kgf/cm}. If the copper foil breaks in this process, carry out a retest.

If it is difficult to carry out the measurement because the thickness of specimen is too thin, fix the specimen on an appropriate board.

(2) Measurement after Soldering
(a) Conditioning: Float the specimen on the solder bath at the specified temperature for a specified duration in the following manner:
(i) Measurement under Normal Condition: Measure the temperature of solder by placing the measuring joint of the thermocouple or the approximate center of the bulb of the L shaped mercury thermometer in the middle part of the molten solder at a depth of 25 mm and adjust the temperature so that it becomes within the range of either $$246 + {2 \atop 0}°C.$$

or $$260 + {2 \atop 0}°C.$$

Put the preconditioned specimen with its copper-clad side facing downwards on the surface of the solder at the upper vertical point above the measuring joint of the thermocouple or the bulb of the L shaped mercury thermometer so that the whole face of the specimen comes in contact with the solder, take out the specimen with the pair of tweezers or the specimen gripper after the appropriate elapse of the time, cool it to room temperature, and check the copper foil surface, copper foil removed surface, edge surface and laminate surface visually to see whether any blister or delamination exists or not.

Use the stopwatch for the time measurement. Keep the temperature at the specified temperature ±2° C. from floating of the specimen to its take out.

During the measurement do not stir the molten solder or move the soldering bath.

Remove oxide film or other dirt from the surface of solder. Wiping with a piece of polytetrafluoroethylene (PTFE) of about 50 mm wide is recommended, for example.

(ii) Measurement after Boiling
(a) Conditioning: Boil the specimen in boiling distilled water for 1 hour, cool it for 30 minutes in running clean water at a temperature of 20°±10° C., take it out and wipe the water on the surface with clean dry gauze or the like, and then test it within 5 minutes.
(b) Measurement Same as (i) above.

Conditions for soldering S 0 to S 4 (specified temperature and duration) are given in the following table.

| | Conditions for Soldering | |
|---|---|---|
| Symbold denoting condition | Specified temperature °C. | Specified duration |
| S0 | 246+²₀ | 5 ± 1 |
| S1 | | 10 ± 1 |
| S2 | 260+²₀ | 5 ± 1 |
| S3 | | 10 ± 1 |
| S4 | | 20 ± 1 |

The specified temperature means the temperature before putting the specimen into the solder.

(b) Measurement Check blisters and delaminations on the copper foil surface, copper-foil-removed surface and edge surface after removing the adhered solder. Cool it to room temperature if there is no abnormality, and measure the peel strength in the same manner as given in the above normal condition.

(3) Measurement at Elevated Temperature (a) Conditioning: Detach the copper foil from one end to an appropriate length, and then condition the specimen for $60\pm5$ minutes at a temperature of $105°\pm2°$ C., $125°\pm2°$ C., or $150°\pm2°$ C.

(b) Measurement: Set the specimen on the supporting device of the testing apparatus. Keep the specified temperature for another 3 minutes or over, then measure the peel strength keeping the conditions as they are in the same way as given in the above normal condition. Carry out the setting of specimen on the supporting device quickly in order to keep the specimen at the specified temperature.

(1) Test of Peel Strength of Inner Layer Copper Foil

The test was conducted in conformity with JIS C 6481.

(2) Time Needed to Inspect Inner Layer Circuit by AOI

After forming an inner layer circuit having a line width of 80 $\mu$m and line spacing of 160 $\mu$m through an etching process with a solution of ferric chloride, time required to check a single $500\times500$ mm circuit board was measured using VISION 206 AOI, a product of Optrotech Co., Ltd.

(3) Evaluation on Haloing

Epoxy-soaked prepregs were put on both sides of the inner layer circuit board prepared in the same manner as described in the above paragraph (2), and the resultant structure was heat-pressed at 180° C. under a pressure of 50 kg/cm$^2$ for 120 minutes, yielding a four-layered board. A hole with a diameter of 0.4 mmf was drilled in the acquired four-layered board, and with the resultant structure dipped in a 12% hydrochloric acid for five minutes, the haloing length was measured.

(4) Measurement of Y

The measurement was conformed to JIS Z 8701.

Example 2

A copper foil for an inner layer circuit of a multi-layered printed circuit board was prepared in the same manner as done in Example 1 except that after copper particles were adhered and fixed on both sides of an electrolytic copper foil as per Example 1, the lustrous surface of the copper foil was subjected to plating of black chromium, instead of burnt deposition of a nickel-copper alloy, under the conditions of bath compositions consisting of 250 g/l of chromium oxide anhydride, 215 g/l of acetic acid and 7.5 g/l of barium acetate, a bath temperature of 40° C., a current density of 15 A/dm$^2$ and a processing time of 60 sec. The acquired copper foil was evaluated in the same manner as done for Example 1. The results of the evaluation are shown in Tables 1 and 2.

Example 3

A copper foil for an inner layer circuit of a multi-layered printed circuit board was prepared in the same manner as done in Example 1 except that, with a 35-$\mu$m thick electrolytic copper foil as a cathode and lead disposed as an anode on both side of the cathode, the copper foil was treated to adhere copper particles on the rough surface and lustrous surface of the copper foil to thereby provide rugged portions under the conditions of bath compositions consisting of copper sulfate pentahydrate containing 30 g/l of copper and 80 g/l of sulfuric acid, a bath temperature of 30° C., a current density of 15 A/dm$^2$ and a processing time of 10 sec, and the resultant structure was sufficiently cleaned with water, thus providing a burnt deposition of a nickel-copper alloy containing 3 mg/dm$^2$ of nickel.

The acquired copper foil was evaluated in the same manner as done for Example 1. The results of the evaluation are shown in Tables 1 and 2.

Example 4

A copper foil for an inner layer circuit of a multi-layered printed circuit board was prepared in the same manner as done in Example 1 except for the use of a 35-$\mu$m thick rolled copper foil in place of an electrodeposited copper foil.

The acquired copper foil was evaluated in the same manner as done for Example 1. The results of the evaluation are shown in Tables 1 and 2.

Example 5

A copper foil for an inner layer circuit of a multi-layered printed circuit board was prepared in the same manner as done in Example 1 except that a burnt deposition of a nickel-copper alloy was provided on both the lustrous and rough surfaces of the copper foil.

The acquired copper foil was evaluated in the same manner as done for Example 1. The results of the evaluation are shown in Tables 1 and 2.

Comparative Example 1

A copper board for an inner layer circuit was prepared in the same manner as done in Example 1 except that after copper particles were adhered and fixed only on the rough surface of an electrolytic copper foil as per Example 1, only the rough-surface side was subjected to zinc plating and chromate processing without providing a burnt deposition of a nickel-copper alloy.

Then, the resultant structure was subjected to etching with a solution of ferric chloride to form an inner layer circuit having a line width of 80 $\mu$m and line spacing of 160 $\mu$m. After only the lustrous-surface side was subjected to a black oxidizing treatment under the conditions of bath compositions consisting of 15 g/l of sodium hydroxide, 30 g/l of sodium teritary phosphate decahydrate and 90 g/l of sodium chlorite, a bath temperature of 85° C. and a processing time of 90 sec, the resultant structure was cleaned with water, thereby yielding an inner layer circuit board.

The acquired inner layer circuit board was evaluated in the same manner as done for Example 1. The results of the evaluation are shown in Tables 1 and 2.

Comparative Example 2

A copper foil for an inner layer circuit of a multi-layered printed circuit board was prepared in the same manner as done in Example 1 except that after copper particles were adhered and fixed only on the rough surface of an electrodeposited copper foil as per Example 1, only the lustrous-surface side was subjected to a black oxidizing treatment, instead of a burnt deposition of a nickel-copper alloy, under the conditions of bath compositions consisting of 15 g/l of sodium hydroxide, 30 g/l of sodium teritary phosphate decahydrate and 90 g/l of sodium chlorite, a bath temperature of 85° C. and a processing time of 90 sec.

The acquired copper foil was evaluated in the same manner as done for Example 1. The results of the evaluation are given in Tables 1 and 2.

Comparative Example 3

The lustrous-surface side of a copper foil for an inner layer circuit of a multi-layered printed circuit board, which was prepared in the same manner as done in Comparative Example 2, was treated under the conditions of a bath composition consisting of 1 g/l of sodium boron hydride, 12.5 pH, a bath temperature of 40° C. and a processing time of 40 sec, and was then cleaned with water. The resultant structure was treated under the conditions of bath compositions consisting of 4 g/l of 36% formalin and 71 g/l of sodium sulfate, 12.5 pH, a bath temperature of 40° C. and a processing time that permits the potential of the copper surface to become −1200 mV (silver-silver chloride reference electrode), and was then cleaned with water, thereby forming a reduced-copper formed foil.

The acquired foil was evaluated in the same manner as done for Example 1. The results of the evaluation are shown in Tables 1 and 2.

Comparative Example 4

A copper foil for an inner layer circuit of a multi-layered printed circuit board was prepared in the same manner as done in Example 1 except that no copper particles were adhered nor secured on the lustrous-surface side of an electrodeposited copper foil.

The acquired copper foil was evaluated in the same manner as done for Example 1. The results of the evaluation are shown in Tables 1 and 2.

Comparative Example =

A copper foil for an inner layer circuit of a multi-layered printed circuit board was prepared in the same manner as done for Example 1 except that after copper particles were adhered and fixed on both rough and lustrous surfaces of an electrolytic copper foil to provide rugged portions under the conditions of bath compositions consisting of copper sulfate pentahydrate containing 30 g/l of copper and 80 g/l of sulfuric acid, antimony trioxide hydrochloride containing 0.1 g/l of antimony, and selenious acid containing 0.1 g/l of selenium, a bath temperature of 30° C., a current density of 15 A/dm$^2$ and a processing time of 10 sec, the resultant structure was cleaned with water and no burnt deposition of a nickel-copper alloy was provided. The acquired copper foil was evaluated in the same manner as done for Example 1. The results of the evaluation are shown in Tables 1 and 2. It is to be noted that the test on separating the inner layer copper foil in this comparative example yielded many copper residuals.

Comparative Example 6

A copper foil for an inner layer circuit of a multi-layered printed circuit board was prepared in the same manner as done for Example 1 except that no burnt plating of a nickel-copper alloy was provided.

The acquired copper foil was evaluated in the same manner as done for Example 1. The results of the evaluation are shown in Tables 1 and 2.

Comparative Example 7

A copper foil for an inner layer circuit of a multi-layered printed circuit board was prepared in the same manner as done for Example 1 except that a black copper oxidizing treatment was conducted instead of a burnt plating of a nickel-copper alloy as per Comparative Example 2. The acquired copper foil was evaluated in the same manner as done for Example 1. The results of the evaluation are shown in Tables 1 and 2.

TABLE 1

| | Foil Type | Roughening Process for Lustrous Surface | Black Plating or Melanism Treatment | Strength of Separating Inner Layer Copper Foil on Lustrous Surface (kgf/cm) |
|---|---|---|---|---|
| Example 1 | Electrodeposited copper foil | Two-phase processing | Ni—Cu, Ni = 5 mg | 1.7 |
| Example 2 | Electrodeposited copper foil | Two-phase processing | Cr, Cr = 5 mg | 1.6 |
| Example 3* | Electrodeposited copper foil | One-phase processing | Ni—Cu, Ni = 3 mg | 1.4 |
| Example 4 | Rolled copper foil | Two-phase processing | Ni—Cu, Ni = 5 mg | 1.6 |
| Example 5* | Electrodeposited copper foil | One-phase processing | Ni—Cu, Ni = 5 mg | 1.7 |
| Comparative Example 1** | Electrodeposited copper foil | None | Black copper oxide | 1.1 |
| Comparative Example 2 | Electrodeposited copper foil | None | Black copper oxide | 0.9 |
| Comparative Example 3 | Electrodeposited copper foil | None | Reducing black copper oxide | 1.1 |
| Comparative Example 4 | Electrodeposited copper foil | None | Ni—Cu, Ni = 5 mg | 0.8 |
| Comparative Example 5 | Electrodeposited copper foil | One-phase processing | None | 1.2 |
| Comparative Example 6 | Electrodeposited copper foil | Two-phase processing | None | 1.5 |
| Comparative Example 7 | Electrodeposited copper foil | Two-phase processing | Black copper oxide | 1.5 |

*Black plating was done on the non-lustrous side.
**Melanism treatment was performed after the circuit was prepared.

TABLE 2

| | Time Required to Inspect Inner Layer (minutes per board) | Haloing Length (μm) | Y (%) |
|---|---|---|---|
| Example 1 | 2.5 | 0 | 12.5 |
| Example 2 | 2.5 | 0 | 12.0 |
| Example 3* | 3 | 0 | 13.8 |
| Example 4 | 2.5 | 0 | 12.3 |
| Example 5* | 2.5 | 0 | 12.8 |
| Comparative Example 1** | 2.5 | 300 | 13.4 |
| Comparative Example 2 | 3 | 300 | 14.2 |
| Comparative Example 3 | 8 | 50 | 17.7 |
| Comparative Example 4 | 2.5 | 0 | 12.8 |
| Comparative Example 5 | 2.5 | 0 | 4.0 |
| Comparative Example 6 | 8 | 0 | 16.5 |
| Comparative Example 7 | 2.5 | 300 | 13.8 |

*Black plating was done on the non-lustrous side.
**Melanism treatment was performed after the circuit was prepared.

Since the copper foil for an inner layer circuit of a multi-layered printed circuit board according to the present invention has its both sides roughened, the bonding strength between the inner layer circuit and prepregs is improved. In addition, a black metal plated layer is formed on the rough surfaces of the copper foil, AOI checking can be performed accurately in a short period of time without causing any haloing phenomenon.

According to the method of the present invention, since both sides of a copper foil are roughened and black metal plating is conducted at the time the copper foil is manufactured, thus providing an excellent production efficiency. Further, since a batch type chemical treatment can be omitted in the step of producing a multi-layered printed circuit board, the quality and productivity of the multi-layered printed circuit board can both be improved at the same time.

What is claimed is:

1. A copper foil for an inner layer circuit of a multi-layered printed circuit board comprising a both surfaces roughened copper foil at least one surface on which is formed a black metal plated layer having a value Y of 15% or below and containing at least one metal selected from the group consisting of nickel, cobalt, chromium, rhodium, tin and copper, and said black metal plated layer being formed by a cathode electrolytic processing on the surface of the copper foil, which faces a surface of an inner layer circuit.

2. A multi-layered printed circuit board comprising an inner layer board having a circuit pattern on a copper foil formed in advance on one side or both sides thereof, and one or more prepregs alternately laminated one on another and having a circuit formed on an uppermost layer and a lowermost layer thereof, wherein the copper foil is set forth in claim 1.

3. The copper foil according to claim 1, wherein the black metal plated layer contains nickel-copper alloy.

4. The copper foil according to claim 1, wherein the black metal plated layer contains nickel-tin alloy.

5. The copper foil according to claim 1, wherein the black metal plated layer contains nickel-tin-copper alloy.

6. The copper foil according to claim 1, wherein the black metal plated layer contains tin-cobalt alloy.

7. The copper foil according to claim 1, wherein the black metal plated layer has a thickness of 100 to 3,000 angstroms.

8. The copper foil according to claim 1, wherein the value of Y of the black plated layer is 13% or below.

9. The copper foil according to claim 1, wherein the black metal plated layer contains nickel or a nickel-copper alloy and has 2 to 20 mg/dm$^2$ amount of nickel.

10. The copper foil according to claim 1, wherein the black metal plated layer contains a tin-nickel alloy and has 5 to 30 mg/dm$^2$ amount of tin and 2 to 12 mg/dm$^2$ amount of nickel.

11. The copper foil according to claim 1, wherein the black metal plated layer contains a nickel-tin-copper alloy and has 1 to 20 mg/dm$^2$ amount of nickel, 5 to 25 mg/dm$^2$ amount of tin and 0.1 to 2 mg/dm$^2$ amount of copper.

12. The copper foil according to claim 1, wherein the black metal plated layer contains a tin-cobalt alloy and has 5 to 15 mg/dm$^2$ amount of tin and 10 to 30 mg/dm$^2$ amount of cobalt.

13. The copper foil according to claim 1, wherein the black metal plated layer contains chromium and has 0.2 to 5 mg/dm$^2$ amount of chromium.

14. The copper foil according to claim 1, wherein the black metal plated layer contains rhodium and has 5 to 15 mg/dm$^2$ amount of rhodium.

15. The copper foil according to claim 1, wherein the both surfaces roughened copper foil is prepared by roughening a lustrous surface of a copper foil having a lustrous surface and a roughened surface.

16. The copper foil according to claim 15, wherein a nickel-copper alloy is burnt-deposited on a lustrous surface of the copper foil, zinc is plated on the roughened surface of the copper foil and a chromate conversion coating is applied on the both plated surface.

17. The copper foil according to claim 15, wherein black chromium is plated on the lustrous surface of the copper foil, zinc is on the roughened surface of the copper foil and a chromate conversion coating is applied on both plated surfaces.

18. The copper foil according to claim 15, wherein the copper foil is treated before the plating to adhere copper particles on the roughened surface and the lustrous surface of the copper foil to thereby provide rugged portions.

19. The copper foil according to claim 15, wherein a nickel-copper alloy is burnt-deposited on the lustrous and roughened surfaces of the copper foil and a chromate conversion coating is applied on the both plated surface.

20. A copper foil for an inner layer circuit of a multi-layered printed circuit board comprising a both surfaces roughened copper foil prepared by roughening a lustrous surface of a copper foil having a lustrous surface and a roughened surface on at least one surface of which is formed a black metal plated layer having a Y value of 15% or below and consisting essentially of at least one of a nickel-copper alloy burnt-deposited layer, a zinc plated layer and a black chromium plated layer, said black metal plated layer being formed by a cathode electrolytic processing on the surface of the copper foil, which faces a surface of an inner layer circuit.

21. A copper foil for an inner layer circuit of a multi-layered printed circuit board comprising a both surfaces roughened copper foil prepared by a process consisting essentially of roughening a lustrous surface of a copper foil having a lustrous surface and a roughened surface on at least one surface of which is formed a black metal plated layer having a Y value of 15% or below and consisting essentially of at least one of a nickel-copper alloy burnt-deposited layer, a zinc plated layer and a black chromium plated layer, said black metal plated layer being formed by a cathode electrolytic processing on the surface of the copper foil, which faces a surface of an inner layer circuit.

22. The copper foil according to claim 1, wherein the black metal plated layer contains a nickel-copper alloy and has a Y value of 12.5%.

23. The copper foil according to claim 1, wherein the black metal plated layer contains chromium and has a Y value of 12.0%.

24. The copper foil according to claim 1, wherein the black metal plated layer contains a nickel-copper alloy and has a Y value of 13.8%.

25. The copper foil according to claim 1, wherein the black metal plated layer contains a nickel-copper alloy and has a Y value of 12.3%.

26. The copper foil according to claim 1, wherein the black metal plated layer contains a nickel-copper alloy and has a Y value of 12.8%.

* * * * *